(12) United States Patent
Naaman et al.

(10) Patent No.: US 10,818,346 B2
(45) Date of Patent: Oct. 27, 2020

(54) QUANTIZING LOOP MEMORY CELL SYSTEM

(71) Applicants: Ofer Naaman, Santa Barbara, CA (US); Donald L. Miller, Export, PA (US); Henry Y Luo, Silver Spring, MD (US)

(72) Inventors: Ofer Naaman, Santa Barbara, CA (US); Donald L. Miller, Export, PA (US); Henry Y Luo, Silver Spring, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/133,305

(22) Filed: Sep. 17, 2018

(65) Prior Publication Data

US 2020/0090738 A1   Mar. 19, 2020

(51) Int. Cl.
*G11C 11/44*   (2006.01)
*G11C 11/16*   (2006.01)
*G06N 10/00*   (2019.01)

(52) U.S. Cl.
CPC .............. *G11C 11/44* (2013.01); *G06N 10/00* (2019.01); *G11C 11/1655* (2013.01);
(Continued)

(58) Field of Classification Search
CPC ....................................................... G11C 11/44
See application file for complete search history.

(56) References Cited

U.S. PATENT DOCUMENTS

| 5,229,962 A | 7/1993 | Yuh et al. |
| 5,260,264 A | 11/1993 | Kurosawa et al. |

(Continued)

FOREIGN PATENT DOCUMENTS

| JP | H076329 A | 1/1995 |
| JP | H09128970 A | 5/1997 |

(Continued)

OTHER PUBLICATIONS

Canadian Office Action corresponding to Canadian Patent Application No. 2996621, dated Dec. 12, 2018.

(Continued)

*Primary Examiner* — Douglas King
(74) *Attorney, Agent, or Firm* — Tarolli, Sundheim, Covell & Tummino LLP

(57) ABSTRACT

One example includes a memory cell system that includes a quantizing loop that conducts a quantizing current in a first direction corresponding to a first stored memory state and to conduct the quantizing current in a second direction corresponding to a second stored memory state. The system also includes a bias element configured to provide a substantially constant flux bias of the quantizing loop in each of the first and second states of the stored memory state. The stored memory state can be read from the memory cell system in response to the substantially constant flux bias and a read current that is provided to the memory cell system. The system further includes a tunable energy element that is responsive to a write current that is provided to the memory cell system to change the state of the stored memory state between the first state and the second state.

20 Claims, 8 Drawing Sheets

(52) U.S. Cl.
CPC ...... *G11C 11/1657* (2013.01); *G11C 11/1673* (2013.01); *G11C 11/1675* (2013.01)

(56) References Cited

U.S. PATENT DOCUMENTS

| | | | |
|---|---|---|---|
| 5,295,093 A * | 3/1994 | Nagasawa | G11C 11/44 326/1 |
| 5,323,344 A * | 6/1994 | Katayama | B82Y 10/00 365/162 |
| 5,365,476 A | 11/1994 | Mukhanov | |
| 6,710,986 B1 | 3/2004 | Sato et al. | |
| 7,252,852 B1 | 8/2007 | Parkin | |
| 9,214,624 B2 | 12/2015 | Lee et al. | |
| 9,251,057 B2 | 2/2016 | Higo et al. | |
| 9,384,827 B1 | 7/2016 | Reohr | |
| 9,443,576 B1 * | 9/2016 | Miller | G11C 11/44 |
| 9,520,181 B1 * | 12/2016 | Miller | G11C 11/44 |
| 9,656,682 B2 | 5/2017 | Ahlemeier | |
| 9,761,305 B2 | 9/2017 | Reohr | |
| 9,779,803 B1 | 10/2017 | Konigsburg | |
| 10,102,902 B2 | 10/2018 | Burnett et al. | |
| 2006/0171190 A1 | 8/2006 | Kawasumi | |
| 2008/0175086 A1 | 7/2008 | Luk | |
| 2009/0303807 A1 | 12/2009 | Lee | |
| 2010/0110803 A1 | 5/2010 | Arai | |
| 2011/0122675 A1 | 5/2011 | Parkinson | |
| 2011/0267878 A1 * | 11/2011 | Herr | G11C 11/44 365/171 |
| 2012/0184445 A1 | 7/2012 | Mukhanov et al. | |
| 2015/0043273 A1 | 2/2015 | Naaman et al. | |
| 2018/0025775 A1 | 1/2018 | Ambrose | |
| 2020/0028512 A1 | 1/2020 | Reohr et al. | |
| 2020/0075093 A1 | 3/2020 | Naaman | |

FOREIGN PATENT DOCUMENTS

| | | |
|---|---|---|
| JP | 2000090009 A | 3/2000 |
| JP | 2000091665 A | 3/2000 |
| JP | 2003318465 A | 11/2003 |
| JP | 2013529380 | 7/2013 |
| JP | 2015525426 | 9/2015 |
| JP | 2016535383 A | 11/2016 |
| KR | 101801901 | 11/2017 |
| WO | 2013180946 | 12/2013 |
| WO | 2015050621 | 4/2015 |
| WO | 20160140889 A1 | 9/2016 |
| WO | 2017091258 A2 | 6/2017 |
| WO | 2018044562 A2 | 3/2018 |

OTHER PUBLICATIONS

Cini et al., "Magnetically induced pumping and memory storage in quantum rings", American Physical Society (APS), Physical Review B—Condensed Matter and Materials Physics, vol. 84, Issue 24, pp. 245201-1-245201-5, Dec. 8, 2011 (Dec. 8, 2011) [retrieved on Jun. 19, 2018 (Jun. 19, 2018) from: https://journals.aps.org/prb/Abstract/10.1103 PhysRevB.84.245201, also available at: https://arxiv.org/pdf/1112.0140.pdf ].

Canadian Office Action corresponding to Canadian Patent Application No. 2,977,378 dated Jun. 21, 2018.

Australian Examination Report for Application No. 2017321215 dated Oct. 22, 2019.

European Office Action for Application No. 16 711 444.6-1203 dated Nov. 14, 2019.

Burm Baek et al: "Hybrid superconducting-magnetic memory device using competing order parameters", Nature Communications, vol. 5, May 28, 2014 (May 28, 2014), XP055276805, DOI: 10.1038/ncomms4888.

Partial Search Report for PCT/US2019/037747 dated Oct. 2, 2019.

Canadian Examination Search Report for Application No. 3035211 dated Dec. 17, 2019.

Japanese Office Action corresponding to Japanese Patent Application No. 2018-533039 dated Mar. 5, 2019.

Baek, B et al, Hybrid superconducting-magnetic memory device using competing order parameters, Nature Communications, vol. 5, May 2014.

Korean Office Action corresponding to Korean Application No. 10 2017 7025552 dated Mar. 5, 2019.

Non Final Office Action for U.S. Appl. No. 16/256,547 dated Apr. 29, 2020.

International Search Report and Written Opinion corresponding to International Application No. PCT/US2018/064320 dated Mar. 3, 2019.

Tahara S et al: "Vortex Transitional Non-Destructive Read-Out Josephson Memory Cell", NEC Research and Development, Nippon Electric Ltd. Tokyo, JP'vol. 34, No. 4, Oct. 1, 1993 A paragraph [0002]; figure 1.

International Search Report for International Application No. PCT/US2019/046138 dated Jul. 21, 2020.

International Search Report for International Application No. PCT/US2020/017944 dated Jun. 29, 2020.

Japanese Office Action for Patent Application No. 2019-544849 dated Jul. 10, 2020.

* cited by examiner

QUANTIZING LOOP MEMORY CELL SYSTEM

TECHNICAL FIELD

This disclosure relates generally to classical and quantum computing systems, and more specifically to a quantizing loop memory cell system.

BACKGROUND

Superconducting digital technology has provided computing and/or communications resources that benefit from unprecedented high speed, low power dissipation, and low operating temperature. For decades, superconducting digital technology has lacked random-access memory (RAM) with adequate capacity and speed relative to logic circuits. This has been a major obstacle to industrialization for current applications of superconducting technology in telecommunications and signal intelligence, and can be especially forbidding for high-end and quantum computing. All concepts currently considered for superconducting memory have been based on quantization of magnetic flux quanta in a superconducting inductive loop. Such memories can be readily adapted to high speed register files given a foundry process with adequate yield, but can never achieve the integration density of complementary metal-oxide semiconductor (CMOS), as they are fundamentally limited by the size of the inductive loop. One hybrid memory solution has been proposed where the memory core implements CMOS technology and the bit-line detection is done with Josephson devices. However, such a configuration yields only nominally higher performance than standard CMOS and suffers from relatively high power dissipation for a cryogenic environment.

SUMMARY

One example includes a memory cell system that includes a quantizing loop that conducts a quantizing current in a first direction corresponding to a first stored memory state and to conduct the quantizing current in a second direction corresponding to a second stored memory state. The system also includes a bias element configured to provide a substantially constant flux bias of the quantizing loop in each of the first and second states of the stored memory state. The stored memory state can be read from the memory cell system in response to the substantially constant flux bias, a read current that is provided to the memory cell system, and the circulating quantizing current. The system further includes a tunable energy element that is responsive to a write current that is provided to the memory cell system to change the state of the stored memory state between the first state and the second state.

Another example includes a method for controlling a memory cell system. The method includes providing a bit-write current on a bit-write line of the memory cell system, the bit-write line being inductively coupled to a quantizing loop. The method includes providing a word-write current on a word-write line of the memory cell system. The word-write line can be inductively coupled to a tunable energy element to reduce an energy barrier between two quantum states of the quantizing loop to provide a quantizing current in one of a first direction and a second direction in the quantizing loop based on the bit-write current in a memory write operation. The first direction of the quantizing current can correspond to a first state of a stored memory state of the memory cell system and the second direction of the quantizing current corresponding to storage of a second state of the stored memory state of the memory cell system. The method also includes providing a word-read current on a word-read line of the memory cell system. The word-read line can be inductively coupled to at least one Josephson junction. The method further includes providing a bit-read current on a bit-read line of the memory cell system to trigger the at least one Josephson junction in response to the first direction of the quantizing current to indicate the first state in a memory read operation and to not trigger the at least one Josephson junction in response to the second direction of the quantizing current to indicate the second state in the memory read operation.

Another example includes a memory array comprising an array of memory cell systems arranged in rows and columns. Each of the memory cell systems includes a quantizing loop configured to conduct a quantizing current in a first direction corresponding to storage of a first state of a stored memory state of the memory cell system and to conduct the quantizing current in a second direction opposite the first direction corresponding to storage of a second state of the stored memory state of the memory cell system. Each of the memory cell systems also includes a tunable energy element in the quantizing loop that is responsive to a word-write current provided on a word-write line associated with each of the memory cell systems of a respective one of the rows and to a bit-write current provided on a bit-write line associated with each of the memory cell systems of a respective one of the columns to change the state of the stored memory state between the first state and the second state. Each of the memory cell systems further includes a bias element configured to provide a substantially constant flux bias of the quantizing loop in the first direction of the quantizing loop in each of the first and second states of the stored memory state. The stored memory state can be read from the memory cell system in response to the substantially constant bias, a word-read current provided on a word-read line associated with each of the memory cell systems of the respective one of the rows, and a bit-read current provided on a bit-read line associated with each of the memory cell systems of the respective one of the columns.

DETAILED DESCRIPTION

This disclosure relates generally to classical and quantum computing systems, and more specifically to a quantizing loop memory cell system. The memory cell system includes a quantizing loop configured to conduct a quantizing current that has a current direction corresponding to a stored memory state. The stored memory state can correspond to the quantizing current having a first direction corresponding to a first state (e.g., a logic-1 state) or can correspond to the quantizing current having a second direction opposite the first direction corresponding to a second state (e.g., a logic-0 state). The memory cell system can also include a bias element and a tunable energy element that are each part of the quantizing loop. The bias element is configured to provide a substantially constant flux bias in the first direction of the quantizing loop. As an example, the bias element can be configured as a hysteretic magnetic Josephson junction (HMJJ) that is arranged substantially constantly in a π-state, and thus can provide a superconducting phase in the first direction of the quantizing loop. As another example, the bias element can be configured as a secondary winding of a transformer that is configured to inductively provide a current as the substantially constant flux bias. The stored memory state of the memory cell system can be read from the memory cell system in response to a read current and the substantially constant flux bias. For example, the read current can include a word-read current provided on a word-read line that is associated with a row of memory cell systems of a memory array and a bit-read current provided on a bit-read line that is associated with a column of memory cell systems of the memory array.

The tunable energy element is configured to be responsive to a write current to affect an energy level of the quantizing loop to set the stored memory state between the first and second states, and thus to set the current direction between the first direction and the second direction. For example, the tunable energy element can be configured as a tunable superconducting quantum interference device (SQUID) that is responsive to the write current to reduce an energy barrier between two quantum states of the quantizing loop to provide the quantizing current in one of the first and second directions. As another example, the tunable energy element can correspond to a magnetic field generator that can set the magnetic state of the bias element configured as a two-layer synthetic antiferromagnet (SAF) HMJJ. Therefore, the magnetic state of the bias element can be temporarily modified during a write operation to change the state of the quantizing loop.

Figure 1:
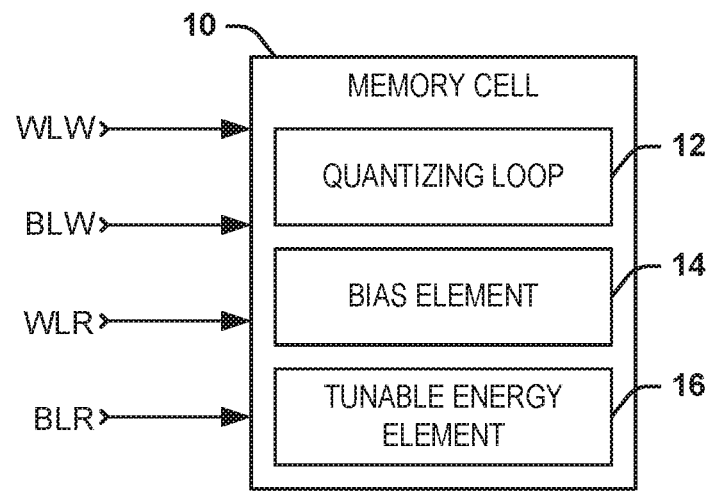
FIG. 1 illustrates an example of a memory cell system.

FIG. 1 illustrates an example of a memory cell system 10. The memory cell system 10 can be implemented in any of a variety of different applications, such as a classical and/or quantum computer system to store data. For example, the memory cell system 10 can be one memory cell of an array of memory cells arranged in rows and columns, such that the array can be configured to store multiple words of data.

The memory cell system 10 includes a quantizing loop 12 configured to conduct a quantizing current that has a current direction corresponding to a stored memory state. The stored memory state can correspond to the quantizing current having a first direction corresponding to a first state (e.g., a logic-1 state) or can correspond to the quantizing current having a second direction opposite the first direction corresponding to a second state (e.g., a logic-0 state). The memory cell system 10 also includes a bias element 14. As an example, the bias element 14 can form part of the quantizing loop, such that the quantizing current flows through the bias element 14. The bias element 14 is configured to provide a substantially constant flux bias in the first direction of the quantizing loop. As an example, the bias element 14 can be configured as a hysteretic magnetic Josephson junction (HMJJ) that is arranged substantially constantly in a π-state, and thus can provide a superconducting phase in the first direction of the quantizing loop. As another example, the bias element 14 can be configured as a secondary winding of a transformer that is configured to inductively provide a current as the substantially constant flux bias.

The memory cell system 10 further includes a tunable energy element 16. The tunable energy element 16 is configured to be responsive to at least one write current to affect an energy level of the quantizing loop 12 to set the current direction between the first direction and the second direction, and thus to set the stored memory state between the first and second states. In the example of FIG. 1, the write current(s) are demonstrated as a word-write current WLW and a bit-write current BLW. As an example, the word-write current WLW can be provided on a word-write line that is associated with all of the memory cell systems 10 in a row of an associated memory array, and the bit-write current BLW can be provided on a bit-write line that is associated with all of the memory cell systems 10 in a column of the associated memory array.

As an example, the tunable energy element 16 can be configured as a tunable superconducting quantum interference device (SQUID) that is responsive to the write currents WLW and BLW to reduce an energy barrier between two quantum states of the quantizing loop to provide the quantizing current in one of the first and second directions. As another example, the tunable energy element 16 can correspond to a magnetic field generator that can set the magnetic state of the bias element 14 configured as a two-layer synthetic antiferromagnet (SAF) HMJJ. Therefore, in the example of the tunable energy element 16 being configured as the magnetic field generator to change the magnetic state of the bias element 14 arranged as a two-layer SAF HMJJ, the magnetic state of the bias element 14 can be temporarily modified during a write operation to change the state of the quantizing loop 12.

The stored memory state of the memory cell system 10 can be read from the memory cell system 10 in response to at least one read current and the substantially constant flux bias provided by the bias element 14. In the example of FIG. 1, the read current(s) are demonstrated as a word-read current WLR provided on a word-read line that is associated with the row of memory cell systems 10 of a memory array, and a bit-read current BLR provided on a bit-read line that is associated with the column of memory cell systems 10 of the memory array. As an example, the substantially constant flux bias can combine with the current direction of the quantizing current to indicate the stored memory state of the memory cell system 10 based on the word-read current WLR and the bit-read current BLR.

For example, in a first current direction of the quantizing current that is in the same current direction as the substantially constant flux bias, the quantizing current and substantially constant flux bias can additively combine to bias at least one Josephson junction associated with the memory cell system 10. Therefore, the at least one Josephson junction can trigger in response to the word-read current WLR and the bit-read current BLR to indicate a first state of the stored magnetic state of the memory cell system 10 (e.g., a logic-1) based on the at least one Josephson junction entering a voltage state, such as detected by a sense register associated with the associated memory array. As another example, in a second current direction of the quantizing current that is in the opposite current direction as the substantially constant flux bias, the quantizing current and the substantially constant flux bias can subtractively combine to reduce the bias of the at least one Josephson junction associated with the memory cell system 10. Therefore, the at least one Josephson junction does not trigger in response to the word-read current WLR and the bit-read current BLR to indicate a second state of the stored magnetic state of the memory cell system 10 (e.g., a logic-0) based on the at least one Josephson junction not entering a voltage state, such as detected by the sense register associated with the associated memory array.

Therefore, as described herein, the memory cell system 10 implements the bias element 14 as a passive circuit element or as a field-tunable element that facilitates storage of the memory state in a more simplistic manner relative to other memory cells, such as hysteretic magnetic Josephson junction devices, such as a typical Josephson magnetic random-access memory (JMRAM), that are latched or unlatched to store the memory state. For example, in a typical HMJJ-based memory cell system, such as the JMRAM, a magnetic spin-valve is implemented as a barrier in an HMJJ, such that the memory state is stored in a latched parallel or anti-parallel alignment of the spin-valve layer moments. Such latching may require careful and specific tuning of the magnetic layer thickness to provide zero or n-phase shift in the HMJJ, and requires that one of the magnetic layers be switchable at a low applied magnetic field, while the other layer of the HMJJ be fixed and not affected by magnetic fields. Such requirements may complicate the optimization of the HMJJ of the JMRAM system. However, by implementing the bias element 14 as a passive circuit element or as a field-tunable element, the magnetic cell system 10 can be operated with much simpler optimization criteria while maintaining the desirable operating margins of writing data to and reading data from the memory cell system 10.

Figure 2:
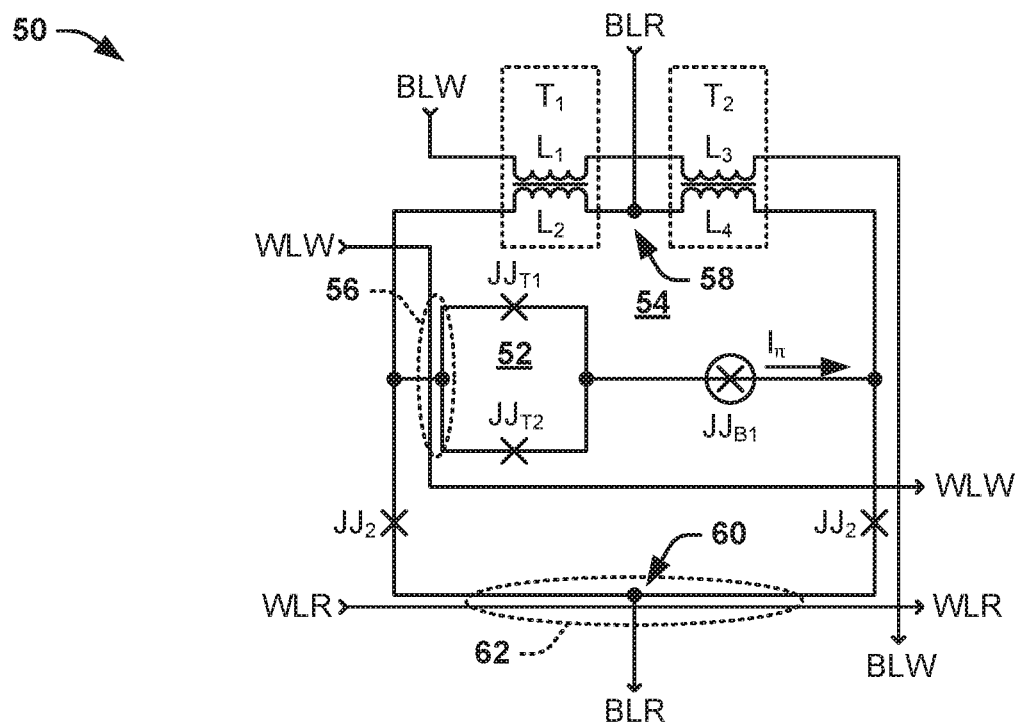
FIG. 2 illustrates an example of a memory cell.

FIG. 2 illustrates another example of a memory cell system 50. The memory cell system 50 can correspond to the memory cell system 10 in the example of FIG. 1, and can thus be one memory cell of an array of memory cells arranged in rows and columns.

The memory cell system 50 includes a first transformer $T_1$ and a second transformer $T_2$, with the first transformer $T_1$ including a primary winding $L_1$ and a secondary winding $L_2$ and the second transformer $T_2$ including a primary winding $L_3$ and a secondary winding $L_4$. The primary windings $L_1$ and $L_3$ are configured to propagate a bit-write current BLW that is provided during a write operation to store a memory state in the memory cell system 50. The bit-write line can be associated with each memory cell system 50 in a column of memory cell systems 50 in a memory array, such that the bit-write current BLW can be provided through primary inductors $L_1$ and $L_3$ of each of the memory cell systems 50 in the column concurrently during the write operation. The secondary windings $L_2$ and $L_4$ are configured to inductively conduct a current in response to the bit-write current BLW during the write operation.

The memory cell system 50 also includes an HMJJ $JJ_{B1}$. The HMJJ $JJ_{B1}$ can correspond to the bias element 14 in the example of FIG. 1, and is therefore demonstrated in the example of FIG. 2 as providing a current $I_\pi$ that can correspond to the substantially constant flux bias. For example, the HMJJ $JJ_{B1}$ can be set to a fixed π-state, such that the substantially constant flux bias associated with the current $I_\pi$ can correspond to a superconducting phase that is substantially constantly provided. As described herein, the term "superconducting phase" corresponds to a spontaneous supercurrent provided by the HMJJ $JJ_{B1}$ in response to the HMJJ $JJ_{B1}$ being set to the fixed π-state, with the supercurrent having an amplitude based on an internal superconductor flux quantum divided by an inductance term (e.g., the amplitude can be one-half a flux quantum divided by the inductance term).

In the example of FIG. 2, the memory cell system 50 also includes a SQUID 52 formed by a pair of Josephson junctions $JJ_{T1}$ and $JJ_{T2}$ in parallel, and which is arranged in series with the HMJJ $JJ_{B1}$. The SQUID 52 can correspond to the tunable energy element 16 in the example of FIG. 1, as described in greater detail herein. In the example of FIG. 2, the series arrangement of the SQUID 52 and the HMJJ $JJ_{B1}$ are in parallel with the secondary windings $L_2$ and $L_4$ of the transformers $T_1$ and $T_2$, respectively, and thus form a quantizing loop 54 configured to conduct a quantizing current that has a current direction corresponding to a stored memory state. The quantizing loop 54 can correspond to the quantizing loop 12 in the example of FIG. 1, and can thus have either a first direction corresponding to a first state (e.g., a logic-1 state) or a second direction opposite the first direction corresponding to a second state (e.g., a logic-0 state).

The SQUID 52 is demonstrated as being inductively coupled to a word-write line that is configured to propagate a word-write current WLW. In the example of FIG. 2, the inductive coupling is demonstrated at 56. As an example, the word-write line can be associated with each memory cell system 50 in a row of memory cell systems 50 in a memory array, such that the word-write current WLW can be inductively coupled to a SQUID 52 of each of the memory cell systems 50 in the row concurrently during the write operation. As described in greater detail herein, the word-write current WLW can be configured to induce a current in the SQUID 52 to reduce an energy barrier of the quantizing loop 54 during the write operation. As a result of the reduction of the energy barrier based on the word-write current WLW, and in response to the state of the bit-write current BLW, the quantizing loop 54 can be configured to conduct a quantizing current $I_Q$ in either a first direction corresponding to a first state of the stored memory state (e.g., a logic-1) or a second direction corresponding to a second state of the stored memory state (e.g., a logic-0).

The memory cell system 50 further includes a pair of Josephson junctions $JJ_1$ and $JJ_2$ that are arranged in series with the parallel combination of the series combination of the bias element 14 and the HMJJ $JJ_{B1}$ in parallel with the series combination of inductors $L_2$ and $L_4$. The Josephson junctions $JJ_1$ and $JJ_2$ can be configured to trigger or not trigger during a read operation to indicate the stored memory state of the memory cell system 50. In the example of FIG. 2, a bit-read line is provided to a node 58 between the secondary windings $L_2$ and $L_4$ of the transformers $T_1$ and $T_2$, respectively, and extends from a node 60 between the Josephson junctions $JJ_1$ and $JJ_2$. The bit-read line can be configured to propagate a bit-read current BLR that can, for example, be substantially constantly provided. As an example, the bit-read line can be associated with each memory cell system 50 in the column of memory cell systems 50 in a memory array, such that the bit-read current BLR can be provided through each of the memory cell systems 50 in the column concurrently during the read operation.

Additionally, a word-read line that propagates a word-read current WLR is inductively coupled, demonstrated at 62, to the node 60. The word-read current WLR can thus inductively provide a bias current to the Josephson junctions $JJ_1$ and $JJ_2$ during a read operation. As an example, the word-read line can be associated with each memory cell system 50 in a row of memory cell systems 50 in a memory array, such that the word-read current WLR can inductively provide a bias current to the Josephson junctions $JJ_1$ and $JJ_2$ of each of the memory cell systems 50 in the row concurrently during the read operation. Therefore, the stored memory state of the memory cell system 50 can be read from the memory cell system 50 in response to the word-read current WLR and the bit-read current BLR, and based on the substantially constant flux bias provided by the HMJJ $JJ_{B1}$ and the state of the SQUID 52.

Figure 3:
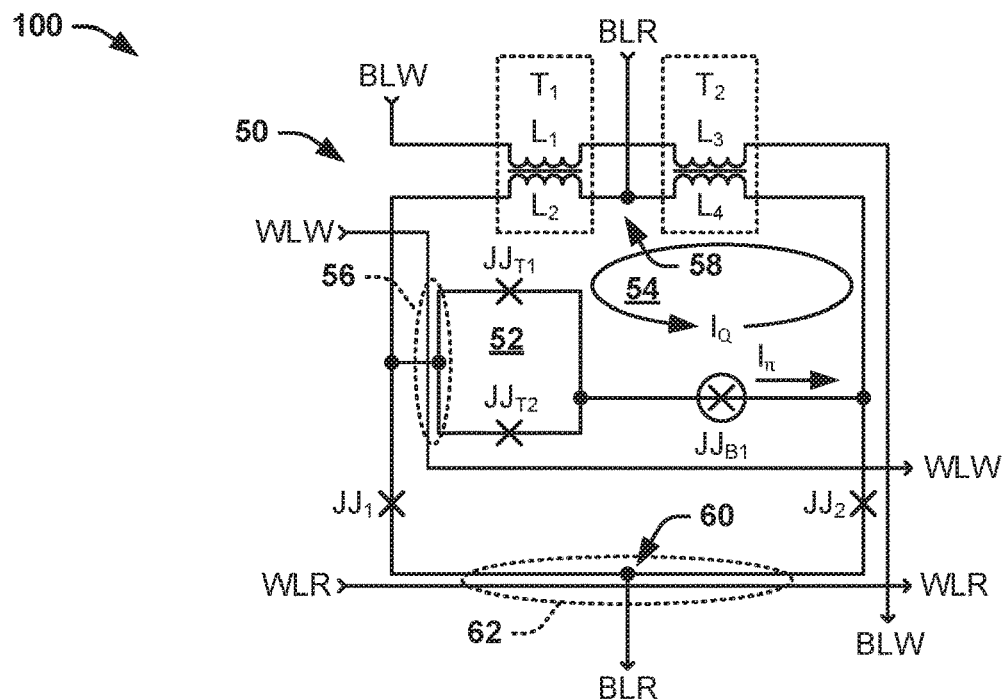
FIG. 3 illustrates another example of a memory cell.

FIG. 3 illustrates an example diagram 100 of the memory cell 50. Therefore, reference is to be made to the example of FIG. 2 in the following description of the example of FIG. 3. In the example of FIG. 3, the quantizing current $I_Q$ is demonstrated as flowing in the quantizing loop 54 in a first direction, demonstrated as a counter-clockwise direction. Because the memory cell system 50 can operate in a superconducting environment, the quantizing current $I_Q$ can be a superconducting current that flows consistently in the zero-resistance superconducting quantizing loop 54.

In the example of FIG. 3, the counter-clockwise current direction of the quantizing current $I_Q$ is thus provided in the same current direction as the substantially constant flux bias $I_\pi$. Therefore, quantizing current $I_Q$ and the substantially constant flux bias $I_\pi$ can additively combine to bias the Josephson junctions $JJ_1$ and $JJ_2$. Therefore, during a read operation, the word-read current WLR can induce a current in the loop formed by the SQUID 52, the HMJJ $JJ_{B1}$, and the Josephson Junctions $JJ_1$ and $JJ_2$. For example, the current induced by the word-read current WLR can provide a clock-wise current in the loop formed by the SQUID 52, the HMJJ $JJ_{B1}$, and the Josephson Junctions $JJ_1$ and $JJ_2$. Therefore, when the current induced by the word-read current WLR is combined with the bit-read current BLR and the additively combined quantizing current $I_Q$ and substantially constant flux bias $I_\pi$, can trigger the Josephson junctions $JJ_1$ and $JJ_2$ and put them into the voltage state. The voltage state can thus be detected on the bit-read line, such as by a sense register, to detect the first stored memory state (e.g., logic-1) of the memory cell system 50.

Figure 4:
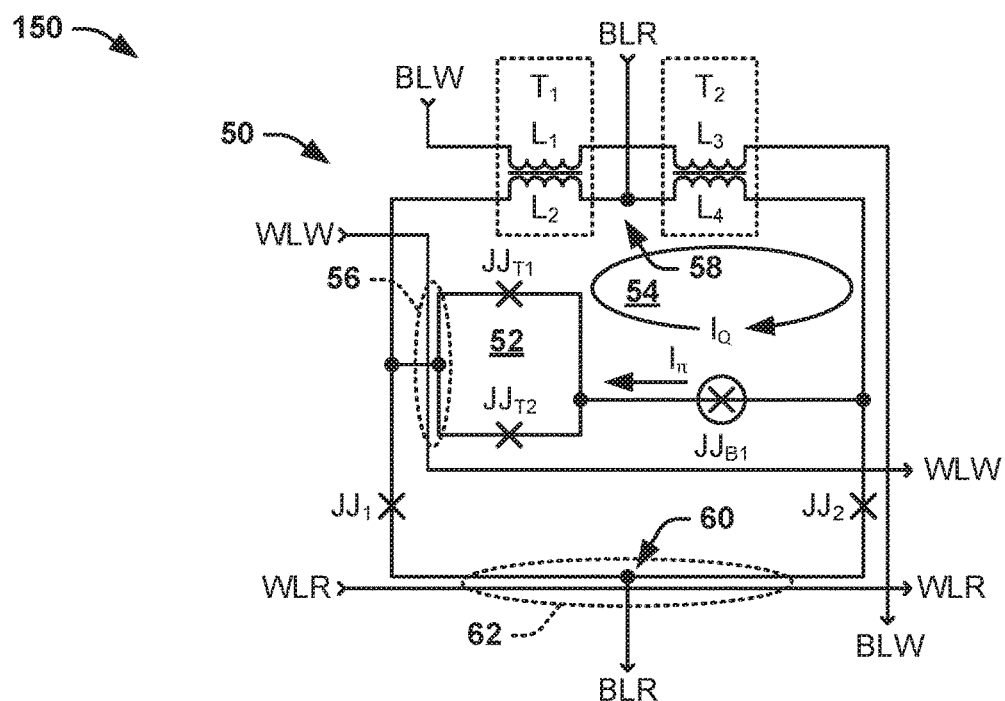
FIG. 4 illustrates another example of a memory cell.

FIG. 4 illustrates an example diagram 150 of the memory cell 50. Therefore, reference is to be made to the example of FIG. 2 in the following description of the example of FIG. 4. In the example of FIG. 4, the quantizing current $I_Q$ is demonstrated as flowing in the quantizing loop 54 in a second direction, demonstrated as a clockwise direction. Similar to as described previously, the quantizing current $I_Q$ can be a superconducting current that flows consistently in the zero-resistance superconducting quantizing loop 54.

In the example of FIG. 4, the clockwise current direction of the quantizing current $I_Q$ is thus provided in an opposite current direction as the substantially constant flux bias $I_\pi$. In addition, in response to setting the direction of the quantizing current $I_Q$ during a write operation based on applying the word-write current WLW and the current direction of the bit-write current BLW, as described in greater detail herein, the SQUID 52 can have a flux quantum bias $I_{FQ}$ in an opposite direction with respect to the substantially constant flux bias $I_\pi$. As an example, the flux quantum bias $I_{FQ}$ and the substantially constant flux bias $I_\pi$ can have approximately equal and opposite amplitudes with respect to each other, such that the quantizing current $I_Q$ can have an amplitude that is approximately twice the amplitude of the substantially constant flux bias $I_\pi$. Therefore, the combination of the quantizing current $I_Q$ and the substantially constant flux bias $I_\pi$ can subtractively combine to reduce the bias of the Josephson junctions $JJ_1$ and $JJ_2$. Therefore, during a read operation, the word-read current WLR can induce a current in the loop formed by the SQUID 52, the HMJJ $JJ_{B1}$, and the Josephson Junctions $JJ_1$ and $JJ_2$. For example, the current induced by the word-read current WLR can provide a clock-wise current in the loop formed by the SQUID 52, the HMJJ $JJ_{B1}$, and the Josephson Junctions $JJ_1$ and $JJ_2$. Therefore, when the current induced by the word-read current WLR is combined with the bit-read current BLR and the combined quantizing current $I_Q$ and substantially constant flux bias $I_\pi$, the Josephson junctions $JJ_1$ and $JJ_2$ do not trigger. Therefore, the Josephson junctions $JJ_1$ and $JJ_2$ do not enter the voltage state. As a result, an approximately zero voltage can be detected on the bit-read line, such as by the sense register, to detect the second stored memory state (e.g., logic-0) of the memory cell system 50.

Figure 5:
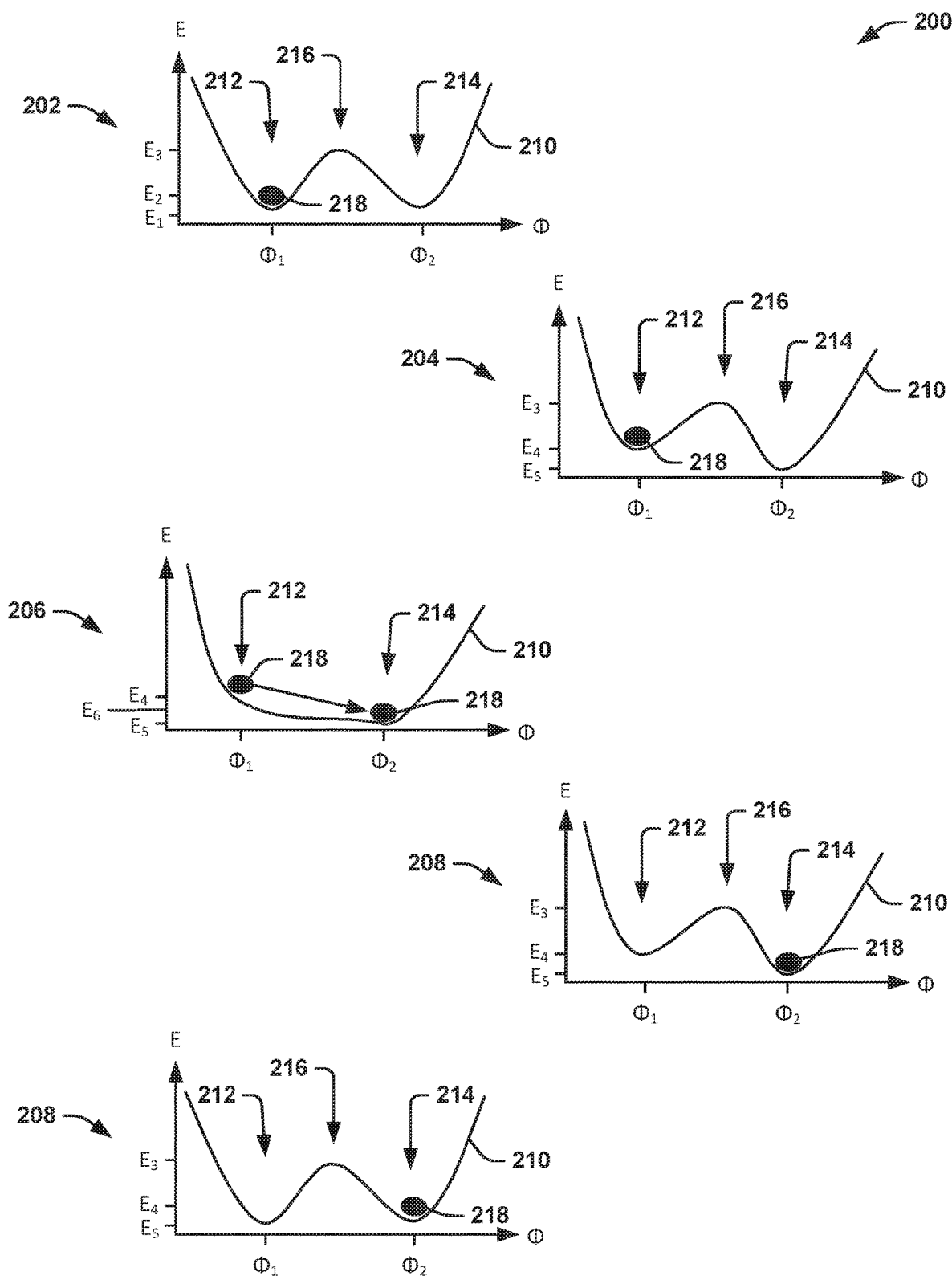
FIG. 5 illustrates an example of a memory write operation.

FIG. 5 illustrates an example diagram 200 of a memory write operation. The diagram 200 demonstrates a sequence of graphs of energy E on the Y-axis plotted as a function of phase $\Phi$ on the X-axis. As an example, the diagram 200 demonstrates a sequence in which the memory cell system 50 changes from the second state (e.g., logic-0) of the stored memory state to the first state (e.g., logic-1) of the stored memory state. The diagram 200 demonstrates the graph of each of a first step 202, a second step 204, a third step 206, a fourth step 208, and a fifth step 209 in the sequence of the write operation. In each of the steps 202, 204, 206, 208, and 209 the graph includes a phase-energy curve 210.

In the first step 202, the phase-energy curve 210 includes a first well 212 and a second well 214 that are separated by a barrier 216. The first and second wells 212 and 214 each have an approximately equal energy of $E_1$, with the barrier 216 having an energy $E_2$ that is greater than the energy $E_1$. Therefore, the energy state of the quantizing loop 54, demonstrated at 218, is substantially stable at a phase $\Phi_1$, which can be representative of the clockwise current direction of the quantizing current $I_Q$, such as demonstrated in the example of FIG. 4. Therefore, the first step 202 demonstrates a substantially stable energy state 218 at the phase $\Phi_1$, and thus the stable second state of the stored memory state of the memory cell system 50.

The second step 204 can demonstrate application of the bit-write current BLW in a first direction, and thus the effect of induced current in the quantizing loop 54. In the example of FIG. 5, the second step 204 demonstrates that the phase-energy curve 210 "tilts" in a first direction, such that the first well 212 increases in energy to an energy $E_4$ and the second well 214 decreases in energy to an energy $E_5$ that is less than the energy $E_4$. Therefore, the relative energy levels of the first and second wells 212 and 214 are separated. However, during the second step 204, the energy state 218 of the quantizing loop 54 remains at the phase $\Phi_1$ due to the barrier 216 between the first and second wells 212 and 214. The tilt of the phase-energy curve 210 can be maintained during application of the bit-write current BLW.

The third step 206 can demonstrate application of the word-write current WLW, and thus the effect of induced current in the tunable energy element (e.g., the SQUID 52). In the example of FIG. 5, the third step 206 demonstrates that the barrier 216 of the phase-energy curve 210 is reduced, such that the barrier 216 decreases to an energy $E_6$ that can be less than the energy $E_4$ and greater than the energy $E_5$. As a result, the barrier 216 no longer separates the first and second wells 212 and 214. Therefore, the energy state 218 of the quantizing loop 54 decreases from the energy $E_4$ to the energy $E_5$, demonstrated by the arrow 220, and thus increases in phase from the phase $\Phi_1$ to the phase $\Phi_2$.

The fourth step 208 can demonstrate cessation of the application of the word-write current WLW, and thus cessation of the induced current in the tunable energy element (e.g., the SQUID 52). In the example of FIG. 5, the fourth step 208 demonstrates that the barrier 216 of the phase-energy curve 210 is increased back to approximately the energy $E_3$, and thus to an energy that is greater than the energy levels $E_4$ and $E_5$. Therefore, the energy state 218 of the quantizing loop 54 is substantially stable at the phase 12, which can be representative of the counter-clockwise current direction of the quantizing current $I_Q$, such as demonstrated in the example of FIG. 3. The fifth step 209 can demonstrate cessation of the application of the bit-write current BLW. Thus, the phase-energy curve 210 returns to the nominal stable state demonstrated in the first step 202. Therefore, the fifth step 209 demonstrates a substantially stable energy state 218 at the phase $\Phi_2$, and thus the stable first state of the stored memory state of the memory cell system 50.

Figure 6:
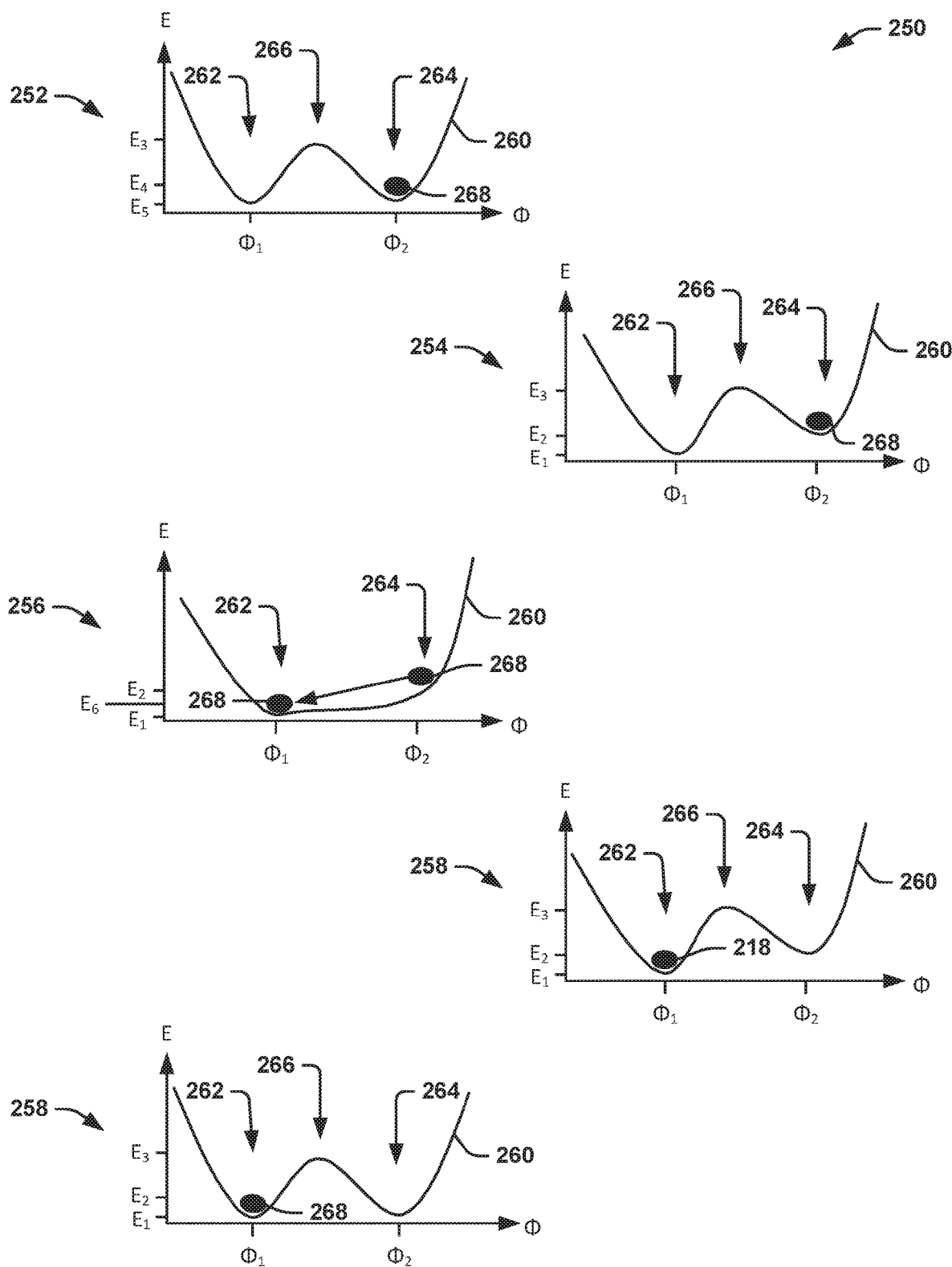
FIG. 6 illustrates another example of a memory write operation.

FIG. 6 illustrates an example diagram 250 of a memory write operation. Similar to the example of FIG. 5, the diagram 250 demonstrates a sequence of graphs of energy E on the Y-axis plotted as a function of phase $\Phi$ on the X-axis. As an example, the diagram 250 demonstrates a sequence in which the memory cell system 50 changes from the first state (e.g., logic-1) of the stored memory state to the second state (e.g., logic-0) of the stored memory state. The diagram 250 demonstrates the graph of each of a first step 252, a second step 254, a third step 256, a fourth step 258, and a fifth state 259 in the sequence of the write operation. In each of the steps 252, 254, 256, 258, and 259, the graph includes a phase-energy curve 260.

In the first step 252, the phase-energy curve 260 includes a first well 262 and a second well 264 that are separated by a barrier 266. The first and second wells 262 and 264 each have an approximately equal energy of $E_4$, with the barrier 266 having an energy $E_3$ that is greater than the energy $E_4$. Therefore, the energy state of the quantizing loop 54, demonstrated at 268, is substantially stable at a phase $\Phi_2$, which can be representative of the counter-clockwise current direction of the quantizing current $I_Q$, such as demonstrated in the example of FIG. 3. Therefore, the first step 252 demonstrates a substantially stable energy state 268 at the phase $\Phi_2$, and thus the stable first state of the stored memory state of the memory cell system 50.

The second step 254 can demonstrate application of the bit-write current BLW in a second direction opposite the first direction (as provided in the second step 204 in the example of FIG. 5), and thus the effect of induced current in the quantizing loop 54. In the example of FIG. 6, the second step 254 demonstrates that the phase-energy curve 260 "tilts" in a second direction opposite the first direction (as provided in the second step 204 in the example of FIG. 5), such that the first well 262 decreases in energy to the energy $E_1$ and the second well 264 increases in energy to the energy $E_2$ that is more than the energy $E_1$. Therefore, the relative energy levels of the first and second wells 262 and 264 are separated. However, during the second step 254, the energy state 268 of the quantizing loop 54 remains at the phase $\Phi_2$ due to the barrier 266 between the first and second wells 262 and 264.

The third step 256 can demonstrate application of the word-write current WLW, and thus the effect of induced current in the tunable energy element (e.g., the SQUID 52). In the example of FIG. 6, the third step 256 demonstrates that the barrier 266 of the phase-energy curve 260 is reduced, such that the barrier 266 decreases to the energy $E_6$ that can be less than the energy $E_2$ and greater than the energy $E_1$. As a result, the barrier 266 no longer separates the first and second wells 262 and 264. Therefore, the energy state 268 of the quantizing loop 54 decreases from the energy $E_2$ to the energy $E_1$, demonstrated by the arrow 270, and thus decreases in phase from the phase $\Phi_2$ to the phase $\Phi_1$.

The fourth step 258 can demonstrate cessation of the application of the word-write current WLW, and thus cessation of the induced current in the tunable energy element (e.g., the SQUID 52). In the example of FIG. 6, the fourth step 258 demonstrates that the barrier 266 of the phase-energy curve 260 is increased back to approximately the energy $E_3$, and thus to an energy that is greater than the energy levels $E_1$ and $E_2$. Therefore, the energy state 268 of the quantizing loop 54 is substantially stable at the phase $\Phi_1$, which can be representative of the clockwise current direction of the quantizing current $I_Q$, such as demonstrated in the example of FIG. 4. The fifth step 259 can demonstrate cessation of the application of the bit-write current BLW. Thus, the phase-energy curve 260 returns to the nominal stable state demonstrated in the first step 252. Therefore, the fifth step 259 demonstrates a substantially stable energy state 268 at the phase $\Phi_1$, and thus the stable first state of the stored memory state of the memory cell system 50.

Figure 7:
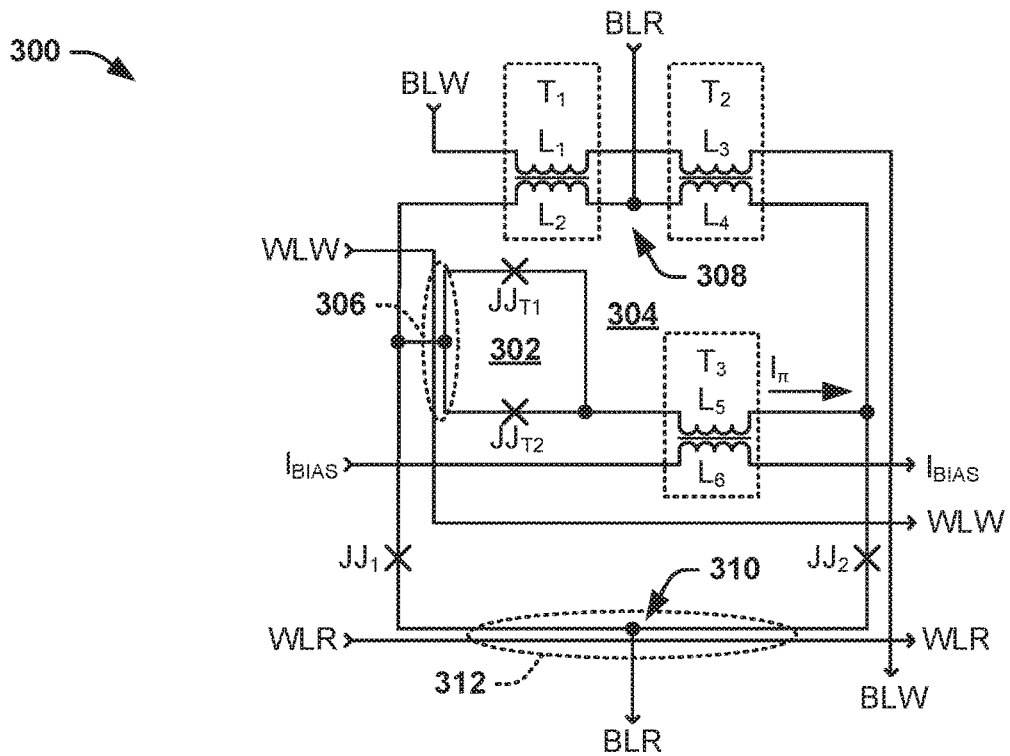
FIG. 7 illustrates another example of a memory cell.

FIG. 7 illustrates another example of a memory cell system 300. The memory cell system 300 can correspond to the memory cell system 10 in the example of FIG. 1, and can thus be one memory cell of an array of memory cells arranged in rows and columns.

The memory cell system 300 includes a first transformer $T_1$ and a second transformer $T_2$, with the first transformer $T_1$ including a primary winding $L_1$ and a secondary winding $L_2$ and the second transformer $T_2$ including a primary winding $L_3$ and a secondary winding $L_4$. The primary windings $L_1$ and $L_3$ are configured to propagate a bit-write current BLW that is provided during a write operation to store a memory state in the memory cell system 300. The bit-write line can be associated with each memory cell system 300 in a column of memory cell systems 300 in a memory array, such that the bit-write current BLW can be provided through primary inductors $L_1$ and $L_3$ of each of the memory cell systems 300 in the column concurrently during the write operation. The secondary windings $L_2$ and $L_4$ are configured to inductively conduct a current in response to the bit-write current BLW during the write operation.

The memory cell system 300 also includes a third transformer $T_3$, with the third transformer $T_3$ including a primary winding $L_5$ and a secondary winding $L_6$. The primary winding $L_5$ is configured to propagate a bias current $I_{BIAS}$ that is substantially constantly provided. Therefore, the secondary winding $L_6$ substantially constantly provides an induced current. The secondary winding $L_6$ can correspond to the bias element 14 in the example of FIG. 1, and therefore, the substantially constant induced current is demonstrated in the example of FIG. 7 as the current $I_\pi$ that can correspond to the substantially constant flux bias. Accordingly, the memory cell system 300 can be configured substantially the same as the memory cell system 50 in the examples of FIGS. 2-4, except with the HMJJ $JJ_{B1}$ being replaced by the transformer $T_3$ to provide the substantially constant flux bias via the secondary winding $L_6$. Thus, the memory cell system 300 also includes a SQUID 302 formed by a pair of Josephson junctions $JJ_{T1}$ and $JJ_{T2}$ in parallel, and which is arranged in series with the secondary winding $L_6$. Accordingly, the series arrangement of the SQUID 302 and the secondary winding $L_6$ in parallel with the secondary windings $L_2$ and $L_4$ of the transformers $T_1$ and $T_2$, respectively, form a quantizing loop 304 configured to conduct the quantizing current $I_Q$, similar to as described previously.

The SQUID 302 is demonstrated as being inductively coupled to a word-write line that is configured to propagate a word-write current WLW. In the example of FIG. 7, the inductive coupling is demonstrated at 306. As an example, the word-write line can be associated with each memory cell system 300 in a row of memory cell systems 300 in a memory array, such that the word-write current WLW can be inductively coupled to a SQUID 302 of each of the memory cell systems 300 in the row concurrently during the write operation. As described in greater detail herein, the word-write current WLW can be configured to induce a current in the SQUID 302 to reduce an energy barrier of the quantizing loop 304 during the write operation. As a result of the reduction of the energy barrier based on the word-write current WLW, and in response to the state of the bit-write current BLW, the quantizing loop 304 can be configured to conduct a quantizing current $I_Q$ in either a first direction corresponding to a first state of the stored memory state (e.g., a logic-1) or a second direction corresponding to a second state of the stored memory state (e.g., a logic-0).

The memory cell system 300 further includes a pair of Josephson junctions $JJ_1$ and $JJ_2$ that are arranged in series with the parallel combination of the series combination of the bias element 14 and the HMJJ $JJ_{B1}$ in parallel with the series combination of inductors $L_2$ and $L_4$. The Josephson junctions $JJ_1$ and $JJ_2$ can be configured to trigger or not trigger during a read operation to indicate the stored memory state of the memory cell system 300. In the example of FIG. 7, a bit-read line is provided to a node 308 between the secondary windings $L_2$ and $L_4$ of the transformers $T_1$ and $T_2$, respectively, and extends from a node 310 between the Josephson junctions $JJ_1$ and $JJ_2$. The bit-read line can be configured to propagate a bit-read current BLR that can, for example, be substantially constantly provided. As an example, the bit-read line can be associated with each memory cell system 300 in the column of memory cell systems 300 in a memory array, such that the bit-read current BLR can be provided through each of the memory cell systems 300 in the column concurrently during the read operation.

Additionally, a word-read line that propagates a word-read current WLR is inductively coupled, as demonstrated at 312, to the node 310. The word-read current WLR can thus inductively provide a bias current to the Josephson junctions $JJ_1$ and $JJ_2$ during a read operation. As an example, the word-read line can be associated with each memory cell system 300 in a row of memory cell systems 300 in a memory array, such that the word-read current WLR can inductively provide a bias current to the Josephson junctions $JJ_1$ and $JJ_2$ of each of the memory cell systems 300 in the row concurrently during the read operation. Therefore, the stored memory state of the memory cell system 300 can be read from the memory cell system 300 in response to the word-read current WLR and the bit-read current BLR, and based on the substantially constant flux bias provided by the secondary winding $L_6$.

For example, the stored memory state of the memory cell system 300 can be read during a read operation in substantially the same manner as described previously in the examples of FIGS. 3 and 4. Similarly, the stored memory state of the memory cell system 300 can be written during a write operation in substantially the same manner as described previously in the examples of FIGS. 5 and 6.

Figure 8:
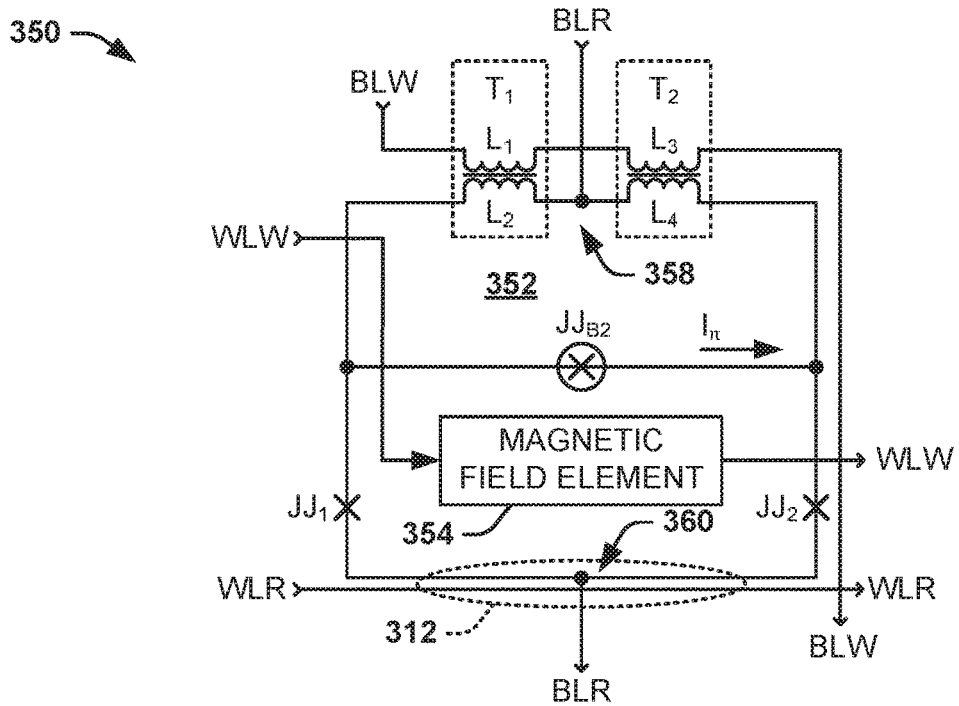
FIG. 8 illustrates another example of a memory cell.

FIG. 8 illustrates another example of a memory cell system 350. The memory cell system 350 can correspond to the memory cell system 10 in the example of FIG. 1, and can thus be one memory cell of an array of memory cells arranged in rows and columns.

The memory cell system 350 includes a first transformer $T_1$ and a second transformer $T_2$, with the first transformer $T_1$ including a primary winding $L_1$ and a secondary winding $L_2$ and the second transformer $T_2$ including a primary winding $L_3$ and a secondary winding $L_4$. The primary windings $L_1$ and $L_3$ are configured to propagate a bit-write current BLW that is provided during a write operation to store a memory state in the memory cell system 350. The bit-write line can be associated with each memory cell system 350 in a column of memory cell systems 350 in a memory array, such that the bit-write current BLW can be provided through primary inductors $L_1$ and $L_3$ of each of the memory cell systems 350 in the column concurrently during the write operation. The secondary windings $L_2$ and $L_4$ are configured to inductively conduct a current in response to the bit-write current BLW during the write operation.

The memory cell system 350 also includes an HMJJ $JJ_{B2}$ arranged in parallel with the secondary windings $L_2$ and $L_4$. The HMJJ $JJ_{B2}$ can correspond to the bias element 14 in the example of FIG. 1, and is therefore demonstrated in the example of FIG. 8 as providing a current $I_\pi$ that can correspond to the substantially constant flux bias. For example, the HMJJ $JJ_{B2}$ can be set to a fixed π-state, such that the substantially constant flux bias associated with the current $I_\pi$ can correspond to a superconducting phase that is substantially constantly provided. As an example, the HMJJ $JJ_{B2}$ can be configured as a two-layer synthetic antiferromagnet (SAF) HMJJ, and can thus have a magnetic state that can be modified in response to an orthogonal magnetic field, as described in greater detail herein. The parallel arrangement of the HMJJ $JJ_{B2}$ with the secondary windings $L_2$ and $L_4$ of the transformers $T_1$ and $T_2$, respectively, form a quantizing loop 352 configured to conduct the quantizing current $I_Q$, similar to as described previously.

Additionally, the memory cell system 350 also includes a magnetic field element 354 arranged proximal with the HMJJ $JJ_{B2}$. The magnetic field element 354 is demonstrated as being coupled to the word-write line that is configured to propagate the word-write current WLW. As an example, the magnetic field element 354 can be configured as an inductor that is configured to provide a magnetic field in response to the word-write current WLW, with the magnetic field being oriented orthogonally with respect to the terminals of the HMJJ $JJ_{B2}$ and in-plane with respect to the quantizing loop 352. For example, the word-write line can be associated with each memory cell system 350 in a row of memory cell systems 350 in a memory array, such that the word-write current WLW can be provided through the magnetic field element 354 of each of the memory cell systems 350 in the row concurrently during the write operation.

As described in greater detail herein, the word-write current WLW can be configured to activate the magnetic field generator 352 to generate a magnetic field that is provided orthogonally with respect to the HMJJ $JJ_{B2}$ to reduce an energy barrier (e.g., the barrier 216 and 266 in the respective examples of FIGS. 5 and 6) of the quantizing loop 352 during the write operation. As a result of the reduction of the energy barrier based on the word-write current WLW, and in response to the state of the bit-write current BLW, the quantizing loop 352 can be configured to conduct a quantizing current $I_Q$ in either a first direction corresponding to a first state of the stored memory state (e.g., a logic-1) or a second direction corresponding to a second state of the stored memory state (e.g., a logic-0). Accordingly, the memory cell system 350 can be configured substantially the same as the memory cell system 50 in the examples of FIGS. 2-4, except with the HMJJ $JJ_{B1}$ being replaced by the HMJJ $JJ_{B2}$ arranged as a two-layer SAF HMJJ to provide the substantially constant flux bias, and the SQUID 52 can be replaced by the magnetic field generator 352.

The memory cell system 350 further includes a pair of Josephson junctions $JJ_1$ and $JJ_2$ that are arranged in series with the parallel combination of the series combination of the bias element 14 and the HMJJ $JJ_{B1}$ in parallel with the series combination of inductors $L_2$ and $L_4$. The Josephson junctions $JJ_1$ and $JJ_2$ can be configured to trigger or not trigger during a read operation to indicate the stored memory state of the memory cell system 350. In the example of FIG. 8, a bit-read line is provided to a node 358 between the secondary windings $L_2$ and $L_4$ of the transformers $T_1$ and $T_2$, respectively, and extends from a node 360 between the Josephson junctions $JJ_1$ and $JJ_2$. The bit-read line can be configured to propagate a bit-read current BLR that can, for example, be substantially constantly provided. As an example, the bit-read line can be associated with each memory cell system 350 in the column of memory cell systems 350 in a memory array, such that the bit-read current BLR can be provided through each of the memory cell systems 350 in the column concurrently during the read operation.

Additionally, a word-read line that propagates a word-read current WLR is inductively coupled to the node 360. The word-read current WLR can thus inductively provide a bias current to the Josephson junctions $JJ_1$ and $JJ_2$ during a read operation. As an example, the word-read line can be associated with each memory cell system 350 in a row of memory cell systems 350 in a memory array, such that the word-read current WLR can inductively provide a bias current to the Josephson junctions $JJ_1$ and $JJ_2$ of each of the memory cell systems 350 in the row concurrently during the read operation. Therefore, the stored memory state of the memory cell system 350 can be read from the memory cell system 350 in response to the word-read current WLR and the bit-read current BLR, and based on the substantially constant flux bias provided by the HMJJ $JJ_{B2}$. For example, the stored memory state of the memory cell system 350 can be read during a read operation in substantially the same manner as described previously in the examples of FIGS. 3 and 4.

Figure 9:
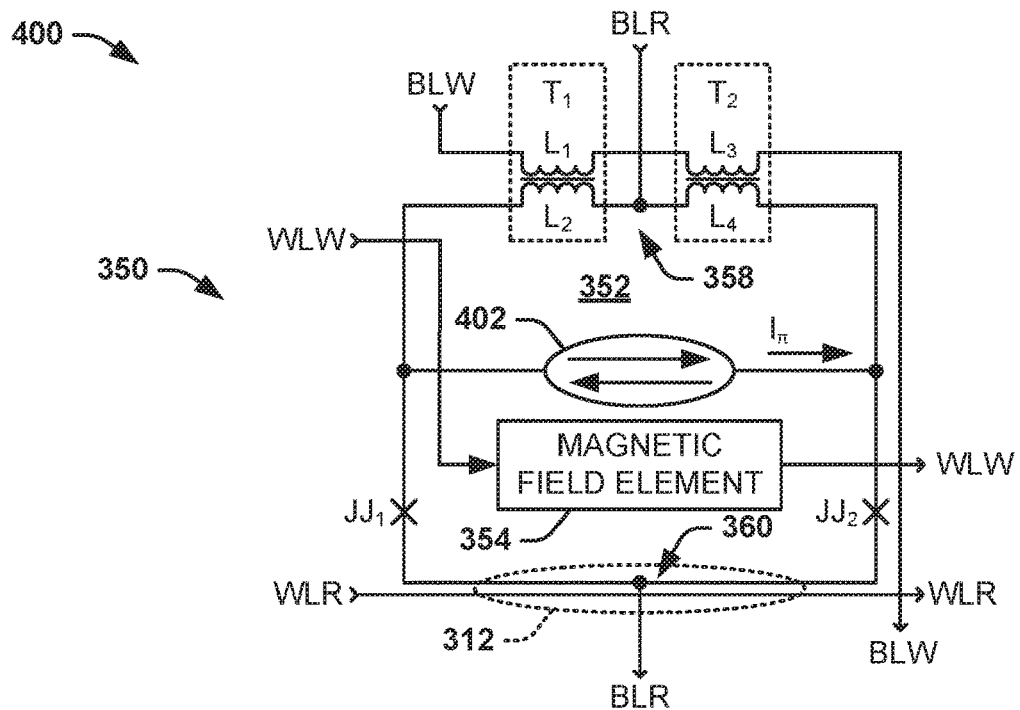
FIG. 9 illustrates another example of a memory cell.

FIG. 9 illustrates another example diagram 400 of the memory cell 350. The diagram 400 demonstrates the memory cell system 350, and thus, reference is to be made to the example of FIG. 8 in the following description of the example of FIG. 9. As described previously, the HMJJ $JJ_{B2}$ can be configured as a two-layer SAF HMJJ, such that the two layers of the HMJJ $JJ_{B2}$ can be strongly magnetically coupled to each other in the anti-parallel direction with respect to each other. As an example, the thicknesses of the SAF layers of the HMJJ $JJ_{B2}$ can be configured such that at an approximately zero magnetic field provided through the HMJJ $JJ_{B2}$, the HMJJ $JJ_{B2}$ is in the π-state. The example of FIG. 9 thus demonstrates the HMJJ $JJ_{B2}$ at 402, with the HMJJ $JJ_{B2}$ having anti-parallel magnetic coupling.

Figure 10:
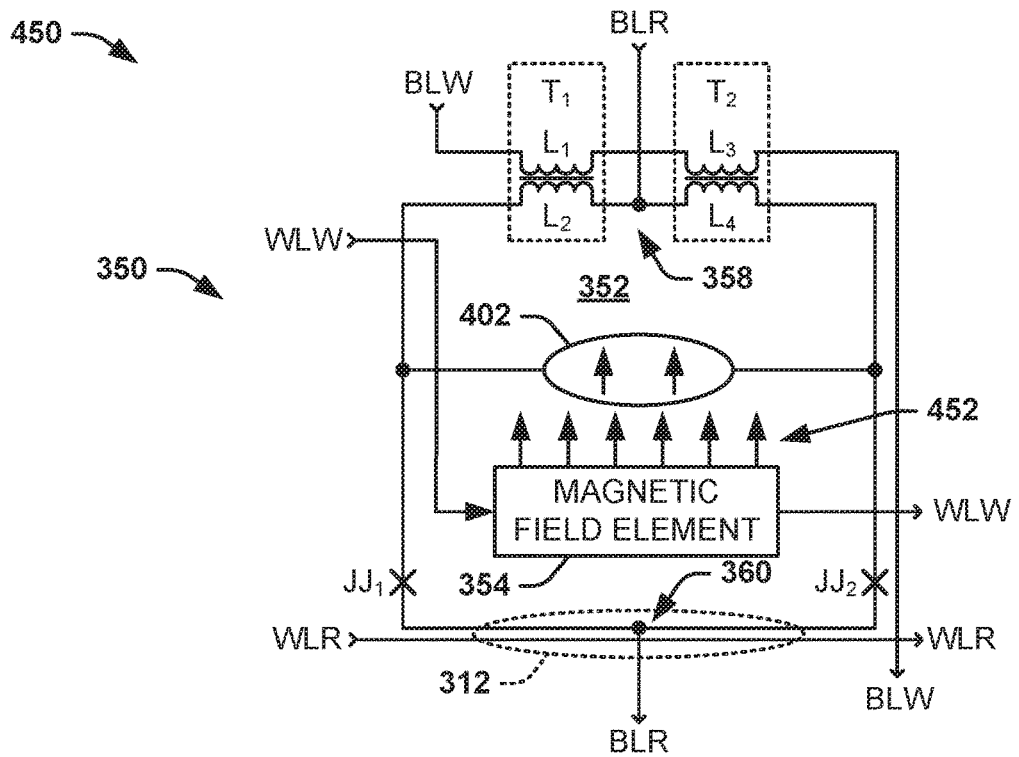
FIG. 10 illustrates another example of a memory cell.

FIG. 10 illustrates another example diagram 450 of the memory cell 350. The diagram 450 demonstrates the memory cell system 350, and thus, reference is to be made to the example of FIGS. 8 and 9 in the following description of the example of FIG. 10. In the example of FIG. 10, the magnetic field element 354 is demonstrated as generating a magnetic field, demonstrated at 452, in a direction that is orthogonal with the anti-parallel magnetic coupling of the HMJJ $JJ_{B2}$, as provided in the example of FIG. 9. Therefore, as demonstrated in the example of FIG. 10, the applied magnetic field 452 causes the magnetic field of the layers of the HMJJ $JJ_{B2}$ to substantially align themselves with the applied magnetic field 452. The alignment of the magnetic field of the layers of the HMJJ $JJ_{B2}$ initially decreases the critical current of the HMJJ $JJ_{B2}$, and eventually, in response to the applied magnetic field 452 having sufficiently high amplitude, the HMJJ $JJ_{B2}$ can transition to a zero-phase state.

The zero-phase state of the HMJJ $JJ_{B2}$ removes the energy barrier between the left- and right circulating current states of the quantizing loop 352, similar to as demonstrated at 206 and 256 in the examples of FIGS. 5 and 6, respectively. As a result, the memory cell system 350 can be written substantially similarly to as demonstrated in the examples of FIGS. 5 and 6, with the magnetic field element 354 providing the magnetic field 452 in response to the word-write current WLW to reduce the energy barrier between the states of the quantizing loop 352. Upon deactivating the magnetic field 452, the HMJJ $JJ_{B2}$ returns to an anti-parallel π-phase configuration which re-establishes the double-well potential of the phase-energy curve (e.g., similar to as described at 210 and 260 in the respective examples of FIGS. 5 and 6). Accordingly, in the absence of the applied magnetic field, the HMJJ $JJ_{B2}$ provides the substantially constant flux bias $I_\pi$ to facilitate reading the stored memory state, similar to as described previously.

Figure 11:
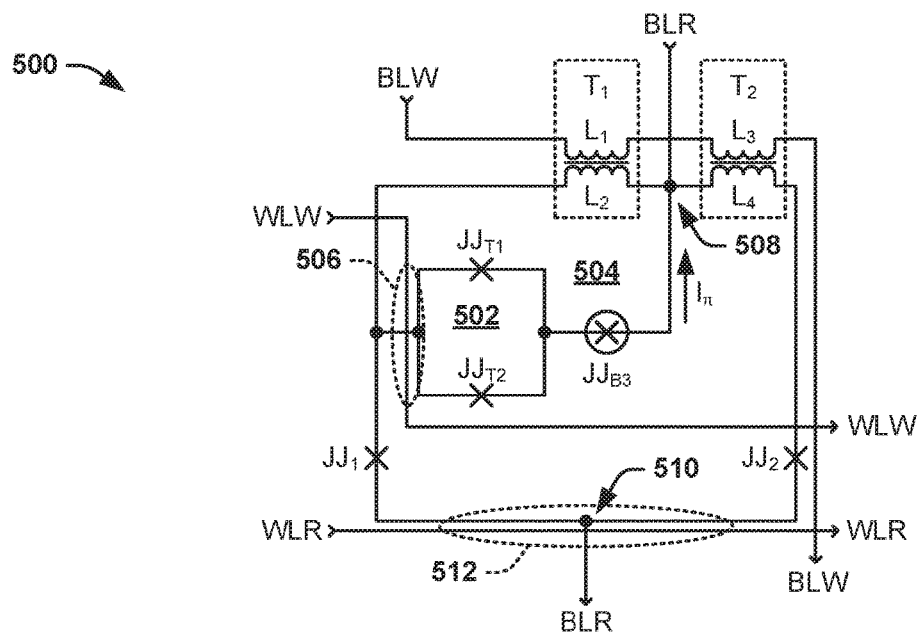
FIG. 11 illustrates another example of a memory cell.

FIG. 11 illustrates another example of a memory cell system 500. The memory cell system 500 can correspond to the memory cell system 10 in the example of FIG. 1, and can thus be one memory cell of an array of memory cells arranged in rows and columns.

The memory cell system 500 includes a first transformer $T_1$, with the first transformer $T_1$ including a primary winding $L_1$ and a secondary winding $L_2$ and an inductor $L_4$. The primary winding $L_1$ is configured to propagate a bit-write current BLW that is provided during a write operation to store a memory state in the memory cell system 500. The bit-write line can be associated with each memory cell system 500 in a column of memory cell systems 500 in a memory array, such that the bit-write current BLW can be provided through primary inductor $L_1$ of each of the memory cell systems 500 in the column concurrently during the write operation. The secondary winding $L_2$ is configured to inductively conduct a current in response to the bit-write current BLW during the write operation.

The memory cell system 500 also includes an HMJJ $JJ_{B3}$ arranged in parallel with the secondary winding $L_2$. The HMJJ $JJ_{B3}$ can correspond to the bias element 14 in the example of FIG. 1, and is therefore demonstrated in the example of FIG. 11 as providing a current $I_\pi$ that can correspond to the substantially constant flux bias. For example, the HMJJ $JJ_{B3}$ can be set to a fixed π-state, such that the substantially constant flux bias associated with the current $I_\pi$ can correspond to a superconducting phase that is substantially constantly provided. As an example, the HMJJ $JJ_{B3}$ can be configured as an HMJJ, similar to as described in the example of FIG. 2, or as a two-layer SAF HMJJ, similar to as described in the example of FIG. 8. In the example of FIG. 11, the HHMJ $JJ_{B3}$ is coupled to a node 508 arranged between the secondary winding $L_2$ of the transformer $T_1$ and an inductor $L_4$, respectively.

Thus, the memory cell system 300 also includes a SQUID 502 formed by a pair of Josephson junctions $JJ_{T1}$ and $JJ_{T2}$ in parallel, and which is arranged in series with the HMJJ $JJ_{B3}$. Accordingly, the series arrangement of the SQUID 502 and the HMJJ $JJ_{B3}$ in parallel with the secondary winding $L_2$ of the transformer $T_1$ forms a quantizing loop 504 configured to conduct the quantizing current $I_Q$, similar to as described previously. The SQUID 502 is demonstrated as being inductively coupled to a word-write line that is configured to propagate a word-write current WLW. In the example of FIG. 11, the inductive coupling is demonstrated at 506. As an example, the word-write line can be associated with each memory cell system 500 in a row of memory cell systems 300 in a memory array, such that the word-write current WLW can be inductively coupled to a SQUID 502 of each of the memory cell systems 300 in the row concurrently during the write operation. As described in greater detail herein, the word-write current WLW can be configured to induce a current in the SQUID 502 to reduce an energy barrier of the quantizing loop 504 during the write operation. As a result of the reduction of the energy barrier based on the word-write current WLW, and in response to the state of the bit-write current BLW, the quantizing loop 504 can be configured to conduct a quantizing current $I_Q$ in either a first direction corresponding to a first state of the stored memory state (e.g., a logic-1) or a second direction corresponding to a second state of the stored memory state (e.g., a logic-0).

The memory cell system 500 further includes a pair of Josephson junctions $JJ_1$ and $JJ_2$ that are coupled to the secondary winding $L_2$ of the transformers $T_1$ and the inductor $L_4$. The Josephson junctions $JJ_1$ and $JJ_2$ can be configured to trigger or not trigger during a read operation to indicate the stored memory state of the memory cell system 500. In the example of FIG. 11, a bit-read line is provided to the node 508 between the secondary winding $L_2$ of the transformer $T_1$ and the inductor $L_4$, and extends from a node 510 between the Josephson junctions $JJ_1$ and $JJ_2$. The bit-read line can be configured to propagate a bit-read current BLR that can, for example, be substantially constantly provided. As an example, the bit-read line can be associated with each memory cell system 500 in the column of memory cell systems 500 in a memory array, such that the bit-read current BLR can be provided through each of the memory cell systems 500 in the column concurrently during the read operation. Additionally, a word-read line that propagates a word-read current WLR is inductively coupled, as demonstrated at 512, to the node 510. The word-read current WLR can thus inductively provide a bias current to the Josephson junctions $JJ_1$ and $JJ_2$ during a read operation. For example, the stored memory state of the memory cell system 500 can be read during a read operation in substantially the same manner as described previously in the examples of FIGS. 3 and 4.

In addition, based on the coupling of the HMJJ $JJ_{B3}$ to the node 508, and because the bit-read current BLR can be substantially constantly provided, the memory state of the memory cell system 500 can be written based on unidirectional application of the bit-write current BLW. For example, because the bit-read current BLR is substantially constantly provided, and because the inductor $L_4$ is not part of the quantizing loop 506, the bit-read current BLR provides a positive unidirectional current component in the quantizing loop 504, as opposed to being provided substantially equally and oppositely through the secondary winding $L_2$ and the inductor $L_4$, as provided in the examples of FIGS. 2, 7, and 8. Therefore, the memory state can be written to set the current direction in the quantizing loop 504 based on application of the bit-write current BLW in a first direction to write the first state and based on a zero amplitude of the bit-write current BLW to write the second state. In other words, the bit-read current BLR provides the suitable bias in the opposite direction of the unidirectional bit-write current BLW to provide the second current direction of the quantizing current $I_Q$, and thus to write the second state of the stored memory state.

Figure 12:
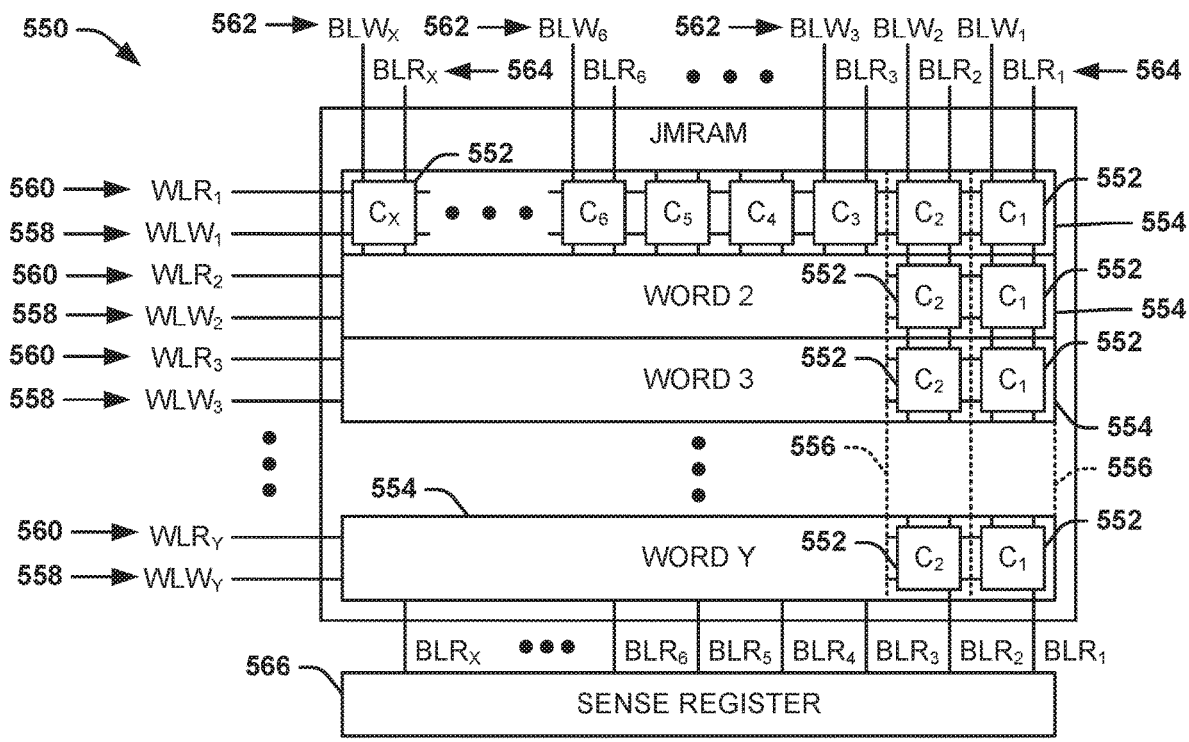
FIG. 12 illustrates an example of a memory array.

FIG. 12 illustrates an example of a memory system 550 in accordance with an aspect of the invention. The JMRAM system 550 can be implemented as a memory structure in a variety of computing applications.

The memory system 550 is demonstrated in the example of FIG. 12 as being arranged as an array of memory cells 552. Specifically, the memory cells 552 are arranged in rows 554 that each correspond to a data word, demonstrated as WORD 1 through WORD Y, where Y is an integer greater than 0. Each of the rows 554 includes a set of memory cells 552 that form X columns 556 across the rows 554, with the memory cells 552 in WORD 1 being demonstrated in the example of FIG. 12 as $C_1$ to $C_X$, where X is an integer greater than 0. Therefore, each of the memory cells 552 in the array of the memory system 550 can be individually addressable by row 554 and column 556.

In the example of FIG. 12, each of the rows 554 is demonstrated as having an associated word-write line 558 and word-read line 560, demonstrated as $WLW_1$ and $WLR_1$ through $WLW_Y$ and $WLR_Y$, respectively. The word-write line 558 and word-read line 560 can be inductively and/or magnetically coupled to each of the memory cells 552 in each of the rows 554 of the memory system 550. In addition, each of the memory cells 552 is demonstrated as having an associated bit-write line 562 and bit-read line 564, demonstrated as $BLW_1$ and $BLR_1$ through $BLW_X$ and $BLR_X$, respectively. The bit-write line 562 and bit-read line 564 can be coupled to each corresponding numbered memory cell 552 in each of the rows 554 of the memory system 550, such that the memory cells 552 in each column 556 are arranged in series with respect to the bit-write line 562 and bit-read line 564. Although the example of FIG. 12 describes that the word-write lines 558 and word-read lines 560 and the bit-write lines 562 and bit-read lines 564 are arranged in series with other adjacent memory cells in the respective row and column, the word-write lines 558 and word-read lines 560 and the bit-write lines 562 and bit-read lines 564 could instead be dedicated with respect to each memory cell 552.

Figure 13:
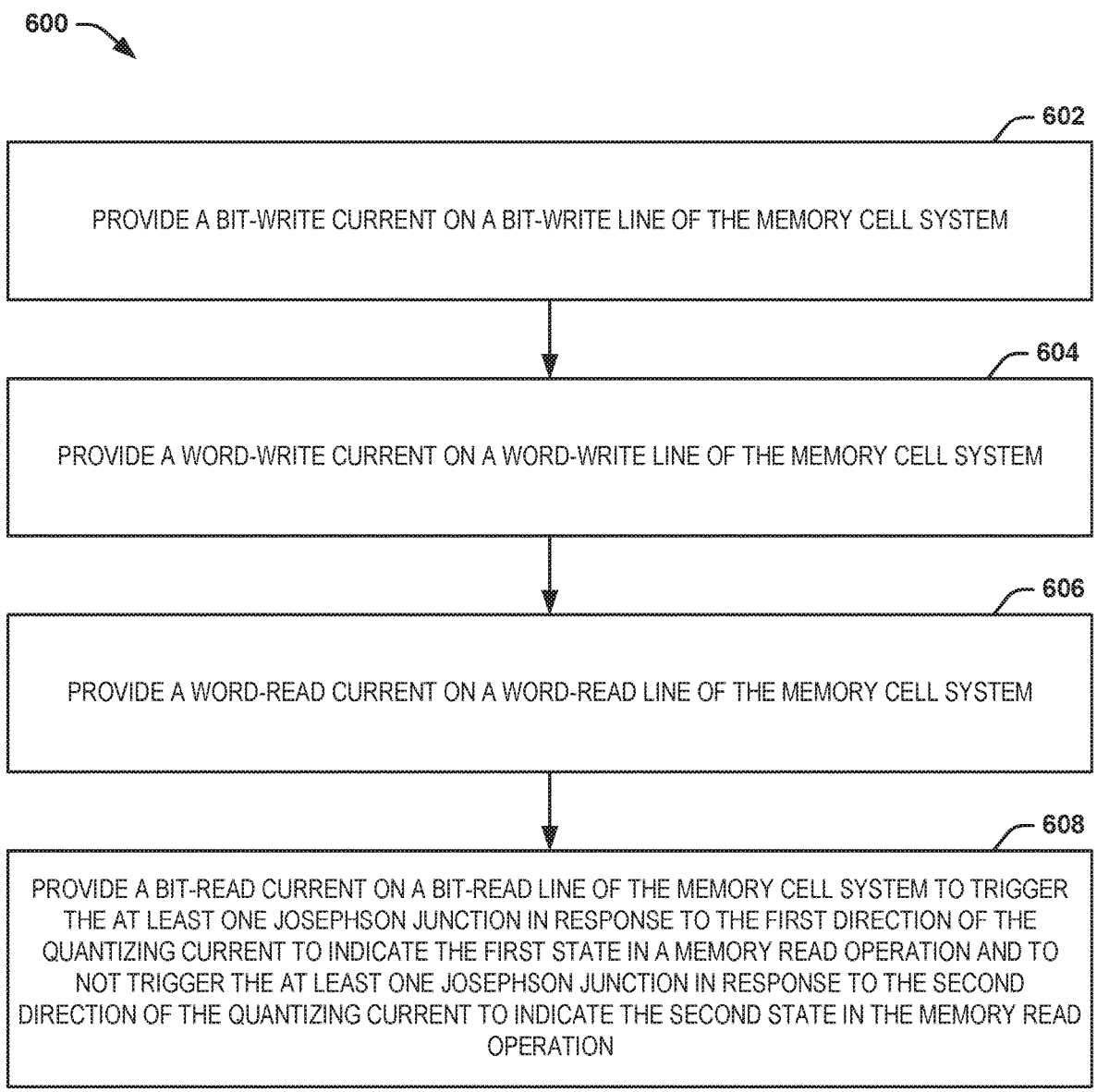
FIG. 13 illustrates an example of a method for controlling a memory cell system.

Each of the memory cells 552 is configured to store a single bit of data. Specifically, each of the memory cells 552 can include at least one phase hysteretic magnetic Josephson junction that can be configured to store a digital state corresponding to a binary logic-1 or a binary logic-0. The digital state can be set in response to a word-write current that is provided on the respective word-write line 558 and a bit-write current that is provided on the respective bit-write line 562. Similarly, the respective digital state that is stored in each of the memory cells 552 can be read from the memory cells 552 based on a word-read current that is provided on the respective word-read line 560 to select a given one of the rows 554 and a bit-read current that is provided on the respective bit-read line 564. Specifically, the bit-read line 564 of each of the columns 556 is coupled to a sense register 566 that is configured to measure the respective bit-read line 564 to determine whether digital state of each of the memory cells 552 of an associated row 554 correspond to a binary logic-1 state or a binary logic-0 state in response to the word-read current and the bit-read current during a data read operation. As an example, the sense register 566 can measure a voltage or a current associated with the bit-read line 564, as described in greater detail herein In view of the foregoing structural and functional features described above, a methodology in accordance with various aspects of the present invention will be better appreciated with reference to FIG. 13. While, for purposes of simplicity of explanation, the methodology of FIG. 13 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 13 illustrates an example of a method 600 for controlling a memory cell system (e.g., the memory cell system 10). At 602, a bit-write current (e.g., the bit-write current BLW) is provided on a bit-write line of the memory cell system. The bit-write line can be inductively coupled to a quantizing loop (e.g., the quantizing loop 12). At 604, a word-write current (e.g., the word-write current WLW) is provided on a word-write line of the memory cell system. The word-write line can be inductively coupled to a tunable energy element (e.g., the tunable energy element 16) to reduce an energy barrier between two quantum states of the quantizing loop to provide a quantizing current (e.g., the quantizing current $I_Q$) in one of a first direction and a second direction in the quantizing loop based on the bit-write current in a memory write operation. The first direction of the quantizing current can correspond to a first state of a stored memory state of the memory cell system and the second direction of the quantizing current corresponding to storage of a second state of the stored memory state of the memory cell system. At 606, a word-read current (e.g., the word-read current WLR) is provided on a word-read line of the memory cell system. The word-read line can be inductively coupled to at least one Josephson junction (e.g., the Josephson junctions $JJ_1$ and $JJ_2$). At 608, a bit-read current (e.g., the bit-read current BLR) is provided on a bit-read line of the memory cell system to trigger the at least one Josephson junction in response to the first direction of the quantizing current to indicate the first state in a memory read operation and to not trigger the at least one Josephson junction in response to the second direction of the quantizing current to indicate the second state in the memory read operation.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A memory cell system comprising:
   a quantizing loop configured to conduct a quantizing current in a first direction corresponding to storage of a first state of a stored memory state of the memory cell system and to conduct the quantizing current in a second direction opposite the first direction corresponding to storage of a second state of the stored memory state of the memory cell system;
   a bias element configured to provide a substantially constant flux bias of the quantizing loop in each of the first and second states of the stored memory state, the stored memory state being read from the memory cell system in response to the substantially constant flux bias and a read current that is provided to the memory cell system; and
   a tunable energy element that is responsive to a write current that is provided to the memory cell system to change the state of the stored memory state between the first state and the second state.

2. The system of claim 1, wherein the bias element is configured as a hysteretic magnetic Josephson junction (HMJJ) that is arranged substantially constantly in a π-state.

3. The system of claim 2, wherein the HMJJ is configured as a two-layer synthetic antiferromagnet (SAF) HMJJ, and wherein the tunable energy element is configured as a magnetic field generator that is configured to provide an orthogonal magnetic field with respect to the two-layer SAF HMJJ in response to the write current to temporarily set the two-layer SAF HMJJ to a zero-state to change the state of the stored memory state between the first state and the second state.

4. The system of claim 3, wherein the write current is a word-write current that is provided on a word-write line to the magnetic field generator, the memory cell system further comprising a bit-write line configured to conduct a bit-write current in a first direction to set the stored memory state to the first state and to conduct the bit-write current in a second direction opposite the first direction to set the stored memory state to the second state.

5. The system of claim 1, wherein the bias element is configured as a secondary winding of a transformer that is arranged in series in the quantizing loop and is inductively coupled to a primary winding of the transformer that is configured to conduct a bias current.

6. The system of claim 1, wherein the tunable energy element is configured as a superconducting quantum interference device (SQUID) that is arranged in series with the bias element in the quantizing loop.

7. The system of claim 6, wherein the write current is a word-write current that is provided on a word-write line that is inductively coupled to the SQUID, the memory cell system further comprising a bit-write line configured to conduct a bit-write current in a first direction to set the stored memory state to the first state and to conduct the bit-write current in a second direction opposite the first direction to set the stored memory state to the second state.

8. The system of claim 1, wherein the write current is a word-write current that is provided on a word-write line that is inductively coupled to the tunable energy element, the memory cell system further comprising a bit-write line comprising a first inductor and a second inductor interconnected by a node coupled to the bias element and to which the read current is provided, wherein the first inductor is inductively coupled to the quantizing current loop, wherein the bit-write line is configured to conduct a bit-write current to set the stored memory state to the first state and to not conduct the bit-write current to set the stored memory state to the second state.

9. The system of claim 1, further comprising at least one Josephson junction, wherein the quantizing current is configured to bias the at least one Josephson junction when provided in the first direction of the quantizing loop, such that the at least one Josephson junction is configured to trigger to provide a voltage in response to the read current and the quantizing current in the first direction to indicate the first state of the stored memory state and to not trigger in response to the read current and the quantizing current in the second direction to indicate the second state of the stored memory state.

10. A memory array comprising an array of memory cell systems comprising the memory cell system of claim 1, the array of memory cell systems being arranged in rows and columns, wherein the write current is a word-write current that is provided on a word-write line associated with a respective row of the array of memory cell systems, wherein a bit-write current is provided on a bit-write line associated with a respective column of the array of memory cell systems, wherein the read current is a bit-read current that is provided on a bit-read line associated with the respective column, and wherein a word-read current is associated with the respective row.

11. A method for controlling a memory cell system, the method comprising:
providing a bit-write current on a bit-write line of the memory cell system, the bit-write line being inductively coupled to a quantizing loop;
providing a word-write current on a word-write line of the memory cell system, the word-write line being inductively coupled to a tunable energy element to reduce an energy barrier between two quantum states of the quantizing loop to provide a quantizing current in one of a first direction and a second direction in the quantizing loop based on the bit-write current in a memory write operation, the first direction of the quantizing current corresponding to a first state of a stored memory state of the memory cell system and the second direction of the quantizing current corresponding to storage of a second state of the stored memory state of the memory cell system;
providing a word-read current on a word-read line of the memory cell system, the word-read line being inductively coupled to at least one Josephson junction; and
providing a bit-read current on a bit-read line of the memory cell system to trigger the at least one Josephson junction in response to the first direction of the quantizing current to indicate the first state in a memory read operation and to not trigger the at least one Josephson junction in response to the second direction of the quantizing current to indicate the second state in the memory read operation.

12. The method of claim 11, wherein providing the bit-read current comprises providing the bit-read current on the bit-read line of the memory cell system, the bit-read current being combined with a substantially constant bias provided from a bias element in the first direction of the quantizing loop in each of the first and second states of the stored memory state.

13. The method of claim 12, wherein the bias element is configured as a hysteretic magnetic Josephson junction (HMJJ) that is arranged substantially constantly in a π-state.

14. The method of claim 12, wherein the bias element is configured as a secondary winding of an inductor that is arranged in series in the quantizing loop and is inductively coupled to a primary winding that is configured to conduct a bias.

15. The method of claim 12, wherein the bias element is coupled to the bit-write line, wherein providing the bit-write current comprises:

providing the bit-write current on the bit-write line to provide the quantizing current in the first direction during the write operation; and
setting the amplitude of the bit-write current to approximately zero to provide the quantizing current in the second direction during the write operation.

16. The method of claim 11, wherein the bit-write line is inductively coupled to the tunable energy element configured as a superconducting quantum interference device (SQUID) that is arranged in the quantizing loop.

17. The method of claim 11, wherein providing the bit-write current comprises:
providing the bit-write current on the bit-write line of the memory cell system in a first direction to provide the quantizing current in the first direction during the write operation; and
providing the bit-write current on the bit-write line of the memory cell system in a second direction to provide the quantizing current in the second direction during the write operation.

18. A memory array comprising an array of memory cell systems arranged in rows and columns, each of the memory cell systems comprising:
a quantizing loop configured to conduct a quantizing current in a first direction corresponding to storage of a first state of a stored memory state of the memory cell system and to conduct the quantizing current in a second direction opposite the first direction corresponding to storage of a second state of the stored memory state of the memory cell system;
a tunable energy element in the quantizing loop that is responsive to a word-write current provided on a word-write line associated with each of the memory cell systems of a respective one of the rows and to a bit-write current provided on a bit-write line associated with each of the memory cell systems of a respective one of the columns to change the state of the stored memory state between the first state and the second state; and
a bias element configured to provide a substantially constant flux bias of the quantizing loop in the first direction of the quantizing loop in each of the first and second states of the stored memory state, the stored memory state being read from the memory cell system in response to the substantially constant bias, a word-read current provided on a word-read line associated with each of the memory cell systems of the respective one of the rows, and a bit-read current provided on a bit-read line associated with each of the memory cell systems of the respective one of the columns.

19. The system of claim 18, wherein the bias element is configured as a hysteretic magnetic Josephson junction (HMJJ) that is arranged substantially constantly in a π-state.

20. The system of claim 18, wherein the tunable energy element is configured as a superconducting quantum interference device (SQUID) that is arranged in series with the bias element in the quantizing loop.

* * * * *